United States Patent [19]
Yoshiba

[11] Patent Number: 6,064,242
[45] Date of Patent: *May 16, 2000

[54] I/O PIN ELECTRONICS CIRCUIT HAVING A PAIR OF DRIVERS

[75] Inventor: Kazumichi Yoshiba, Gyoda, Japan

[73] Assignee: Advantest Corp., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/817,755

[22] PCT Filed: Dec. 28, 1995

[86] PCT No.: PCT/JP95/02744

§ 371 Date: Jun. 23, 1997

§ 102(e) Date: Jun. 23, 1997

[87] PCT Pub. No.: WO97/24622

PCT Pub. Date: Oct. 7, 1997

[51] Int. Cl.[7] ....................................... H03B 1/00
[52] U.S. Cl. ........................... 327/109; 327/407; 371/27.1
[58] Field of Search ...................... 327/333, 108, 327/560, 561, 99, 109, 407, 100; 307/126, 130; 371/22.1, 27.1; 395/183.06

[56] References Cited

U.S. PATENT DOCUMENTS 5,430,400  7/1995  Herlein et al. ........................... 327/108

FOREIGN PATENT DOCUMENTS

| 60-60572 | 4/1985 | Japan . |
| 3-255377 | 11/1991 | Japan . |
| 4-259868 | 9/1992 | Japan . |
| 4-305178 | 10/1992 | Japan . |

Primary Examiner—Kenneth B. Wells
Assistant Examiner—Minh Nguyen
Attorney, Agent, or Firm—Muramatsu & Associates

[57] ABSTRACT

An I/O pin electronics circuit for semiconductor test system to perform an I/O common test as well as an I/O separate device test without causing unused circuit in a comparison circuit, a comparison voltage generation circuit, a wave formatter circuit and a supply voltage generation circuit and without decreasing the number of devices that can be simultaneously tested, for high speed devices where an I/O dead band poses a problem. The I/O pin electronics circuit includes a pair of drivers which are commonly connected to a supply/termination voltage generation circuit and a wave formatter circuit, and a comparator having a comparison circuit and a comparison voltage generation circuit is connected to one of the drivers.

9 Claims, 8 Drawing Sheets

| CONT 1a | CONT 1b | CONT 2a | CONT 2b | Operation | |
|---|---|---|---|---|---|
| | | | | DR1 | DR2 |
| 0 | 0 | 1 | 0 | Termination | Pattern Generation |
| 1 | 0 | 0 | 0 | Pattern Generation | Termination |

us
I/O PIN ELECTRONICS CIRCUIT HAVING A PAIR OF DRIVERS

TECHNICAL FIELD

This invention relates to an I/O pin electronics circuit which is capable of performing both an I/O common test and an I/O separate test.

BACKGROUND ART

Figure 5A:
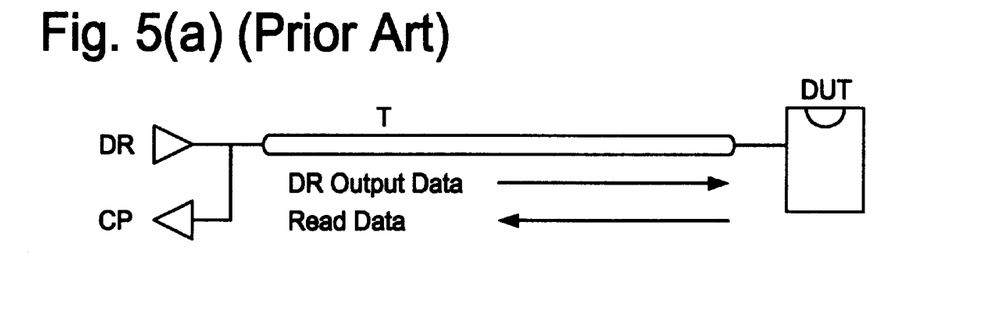
FIG. 5(a) is a connection diagram.

In a semiconductor test system, a conventional I/O pin electronics circuit has an I/O common pin which functions both as a driver (DR) and a comparator (CP) as shown in FIG. 5(a). The DR and the CP are connected to a device to be tested (DUT) through a cable having a signal propagation delay time T.

Figure 5B:
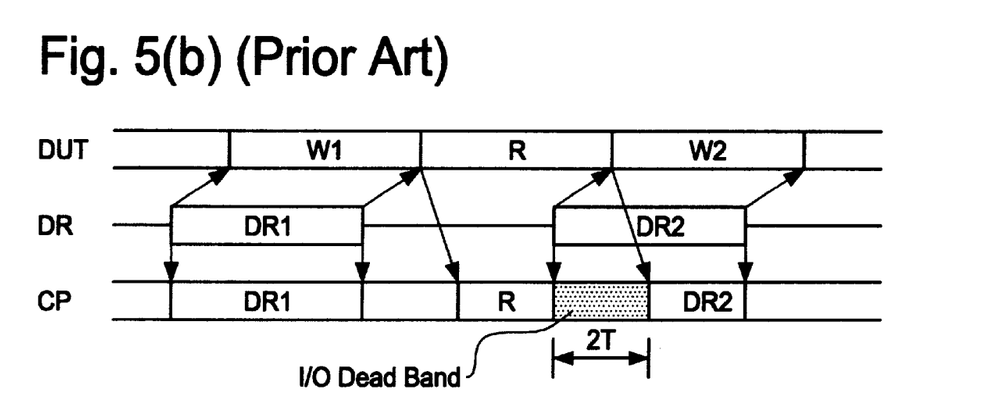
FIG. 5(b) is a timing diagram showing the I/O common test.

FIG. 5(b) shows a timing diagram of a case where writing and reading operations are repeated. The output data DR1 from the DR reaches the DUT terminal after a time T, which becomes writing data W1. When the reading operation begins, the data R read out from the DUT reaches the CP terminal after the time T. At the end of the reading operation, in order to immediately begin the writing operation, data DR2 must be generated by the DR by the time T earlier than the time when writing data W2 reaches the DUT. The data DR2 generated by the DR reaches the CP terminal without delay. As a result, at the CP terminal, there exists a time in which the reading data R from the DUT and the data DR2 generated by the DR itself are combined. The time during which such signal coupling occurs is twice the length of the time T in which accurate comparison and evaluation of the DUT is unavailable. This time range is called an I/O dead band, and is determined by the signal propagation delay time T between the DR, the CP and the DUT.

Figure 6A:
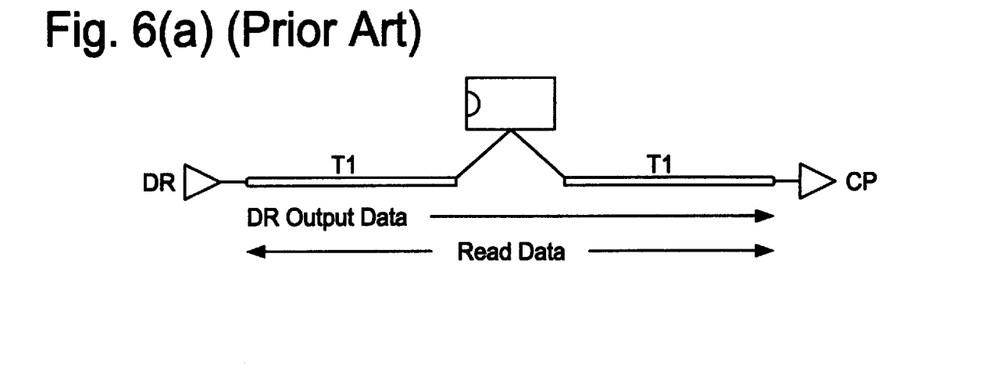
FIG. 6(a) is a connection diagram.
Figure 6B:
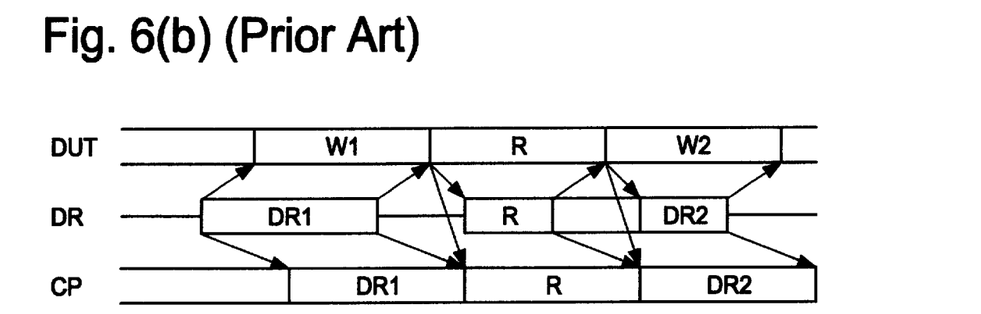
FIG. 6(b) is a timing diagram showing the I/O separate test.

When testing high speed devices wherein the I/O dead band poses a problem, an I/O separate test is performed in which a signal path from the DR to the DUT and a signal path from the DUT to the CP are separated from one another for testing the device as shown in FIG. 6(a). As shown in FIG. 6(b), signal coupling will not be involved at the CP terminal between the reading data R from the DUT and the output data DR1 and DR2 from the DR. Hence, the accurate comparison and evaluation of the device can be performed by the CP. The output data DR2 and the read data R from the DUT will be coupled at the DR terminal. However, the coupling between the traveling waves only pass each other with no adverse effects, and the wave form from the DUT will not affect the CP terminal since it is terminated by the DR terminal.

Figure 7:
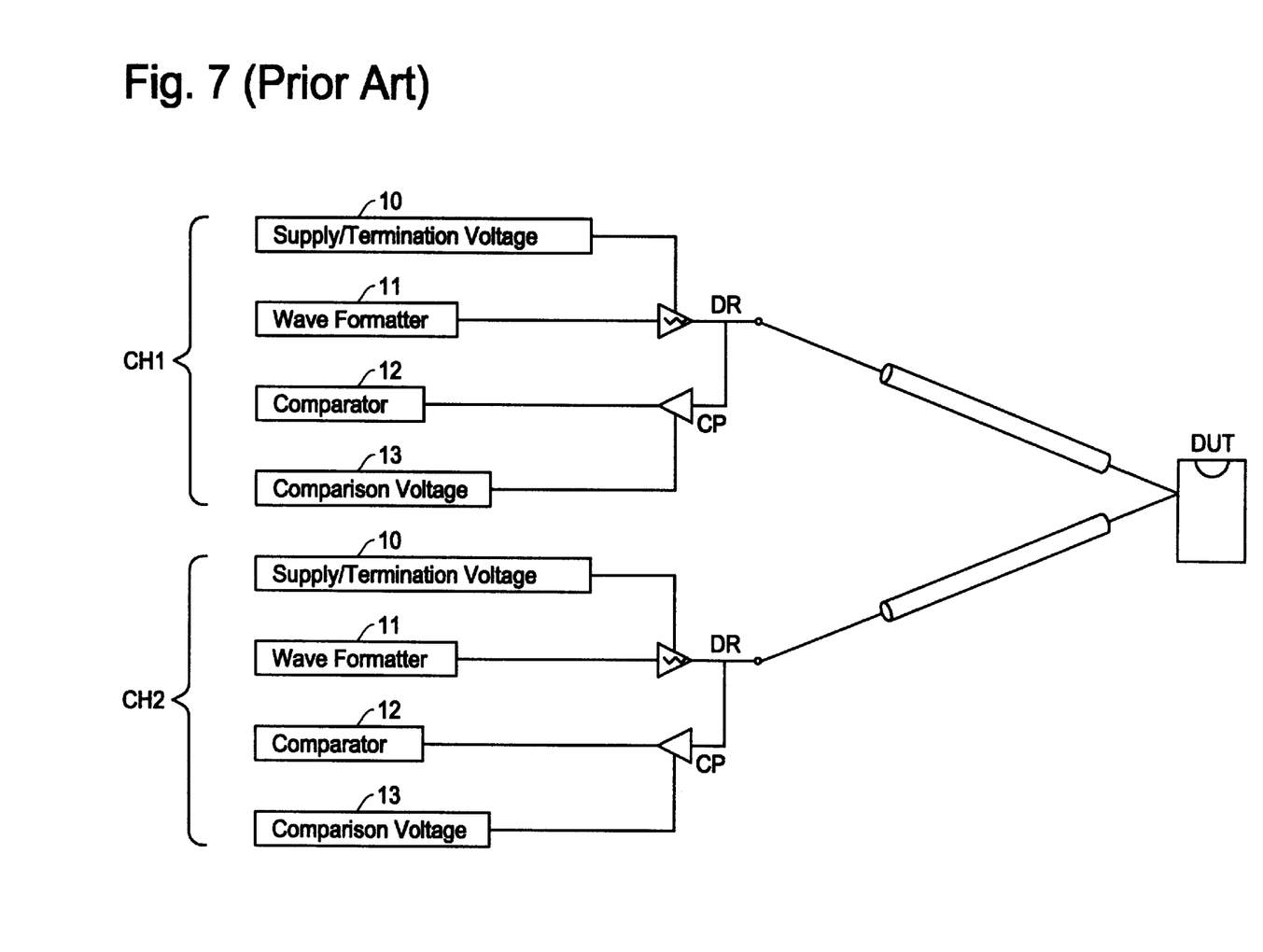
FIG. 7 is a block diagram for performing the I/O separate test using a conventional I/O common pin.

In general, an I/O pin electronics circuit utilizes an I/O common pin. FIG. 7 shows a conventional example in which an I/O common pin is used for an I/O separate test wherein the DR and the DUT, and the DUT and the CP are respectively connected by separate routes. In this example, an I/O common pin CH1 is used as the DR and an I/O common pin CH2 is used as the CP.

Figure 8:
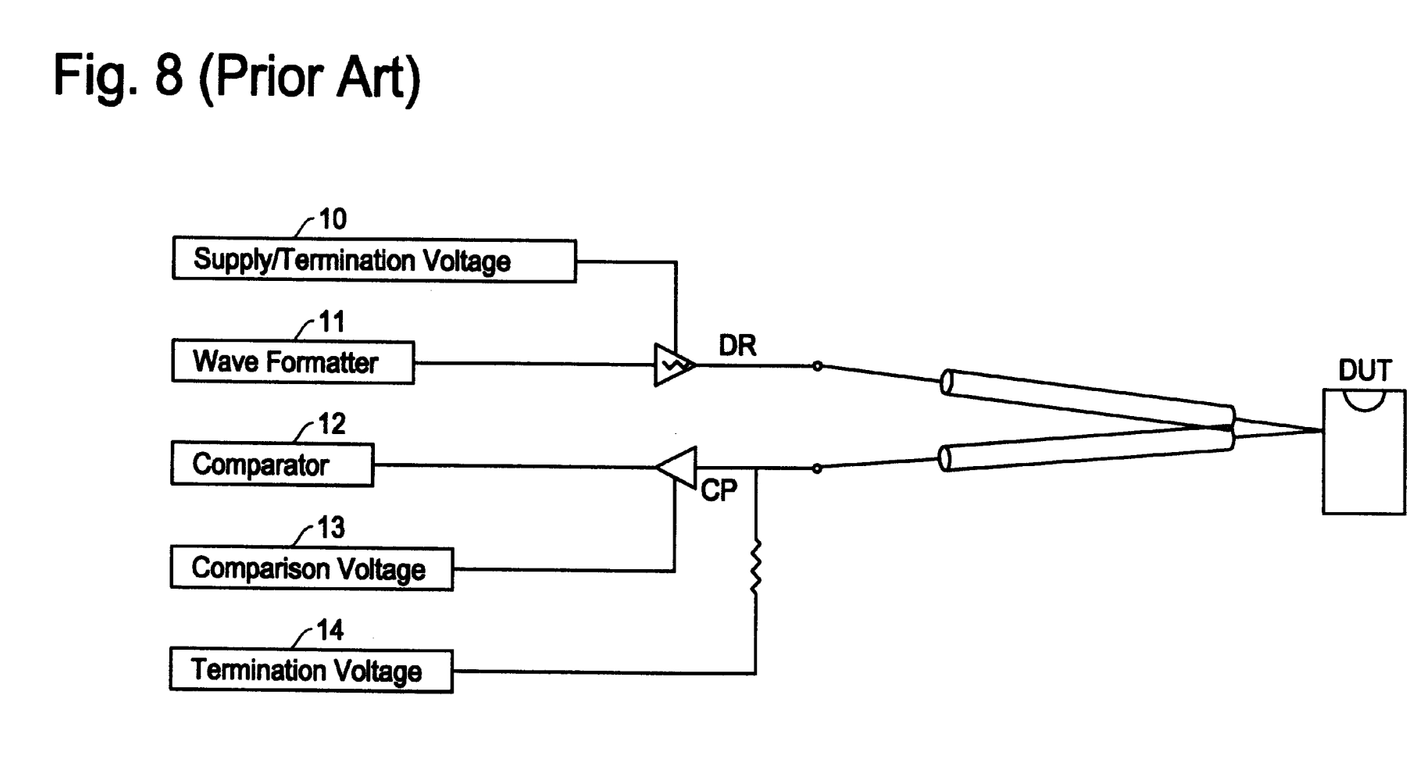
FIG. 8 is a block diagram for performing the I/O separate test using a conventional I/O separate pin.

An I/O separate pin as shown in FIG. 8 is suitable for the I/O separate test. The I/O separate test can be performed by connecting the DR and the DUT, and the DUT and the CP, separately.

As shown in FIG. 7, in case where the I/O separate test is performed by the I/O common pin, the number of the I/O common pins required is doubled compared to that required in the normal test situation using the I/O common pins. Hence, the number of DUTs that can be simultaneously tested is decreased in half. Further, the comparator circuits and comparison voltage generator circuits in the CH1 are useless in such a situation since the CH1 is used only as a driver DR. As for the CH2, wave formatter circuits and voltage generation circuits are useless since the CH2 is used only as a comparator CP.

As shown in FIG. 8, the I/O separate test by the I/O separate pin does not produce useless circuits in the comparator circuits, comparison voltage generation circuits, wave formatter circuits or voltage generation circuits. However, the I/O separate pin cannot perform the test as an I/O common pin.

In the I/O separate test, for the reading cycle, the DUT has to have sufficient drive power since both of the DR and CP ends are terminated. The DUT having insufficient drive power cannot undertake the I/O separate test, and has to undertake only the I/O common test. Further, in the I/O separate test, in testing one pin of the DUT by both the DR and the CP, the required number of wiring between the DUT and the semiconductor test system increases compared to the case of the I/O common test. When a plurality of DUTs are tested in parallel at the same time, the I/O common test is preferable to avoid the complexity of the wiring.

SUMMARY OF THE INVENTION

This invention aims to provide an I/O pin electronics circuit that enables device tests, particularly in testing high speed devices where the I/O dead band poses a problem in achieving the accurate test, without decreasing the number of DUTs that can be simultaneously tested. The I/O pin electronics of the present invention enables the device test, in addition to the conventional I/O common test, without causing unused circuits in the comparator circuits, the comparison voltage generation circuits, the wave formatter circuits or the voltage generation circuits.

In the present invention, a plurality of drivers, for instance two drivers DR1 and DR2, are provided each of which shares a supply/termination voltage generation circuit and a wave formatter circuit. In addition, a comparator composed of a comparison circuit and a comparison voltage generation circuit is provided which is connected to at least one of the drivers, such as one of the DR1 and DR2.

The supply/termination voltage generation circuit generates three kinds of voltages. Each voltage is provided to two drivers, DR1 and DR2, through switch circuits. Each switch circuit is controlled by a pattern signal (PAT) and a drive enable signal (DRE) provided from the corresponding wave formatter circuit, as well as control signals CONT1a, CONT1b, CONT2a and CONT2b provided to a driver control circuit. The input of the comparator is connected to the output of either one of the DR1 or DR2.

According to the present invention configured as above, the I/O pin electronics circuit is capable of performing the I/O common test by enabling the DR2 as a driver and setting the DR1 as a terminal impedance. The I/O pin electronics circuit is also capable of performing the I/O separate test by enabling the DR1 as a driver and setting the DR2 as a terminal impedance of the CP.

DESCRIPTION OF THE PREFERRED EMBODIMENTS

Figure 1:
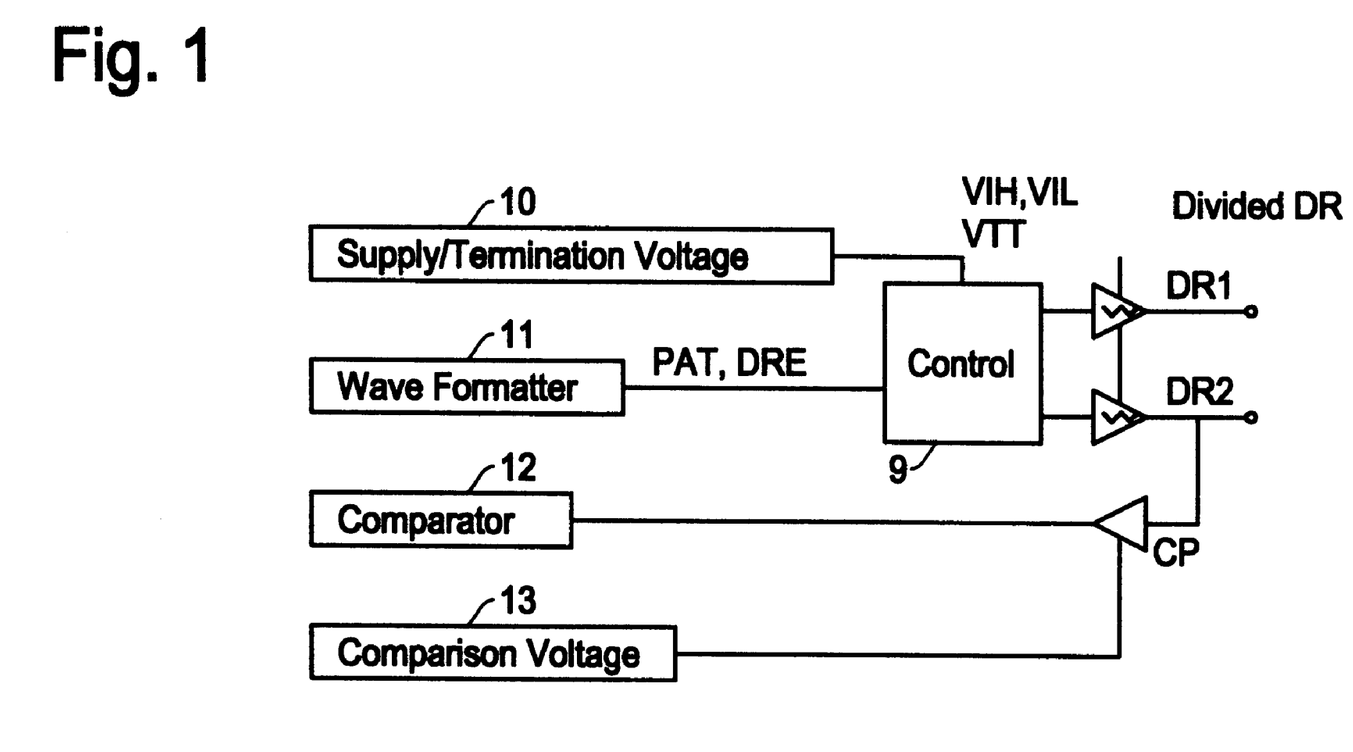
FIG. 1 is a block diagram showing an I/O pin electronics circuit of the present invention.
Figure 4A:
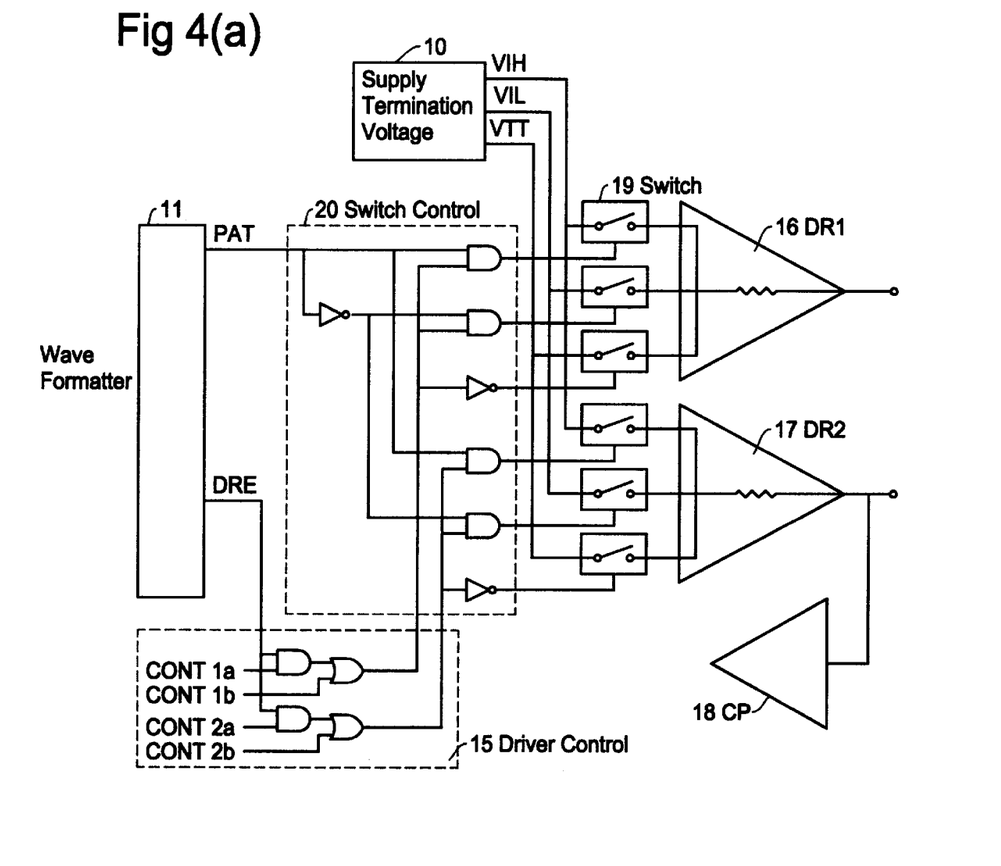
FIG. 4(a) is a detailed block diagram of the I/O pin electronics circuit of the present invention and FIG. 4(b) is a schematic diagram for explaining the operation.
Figure 4B:
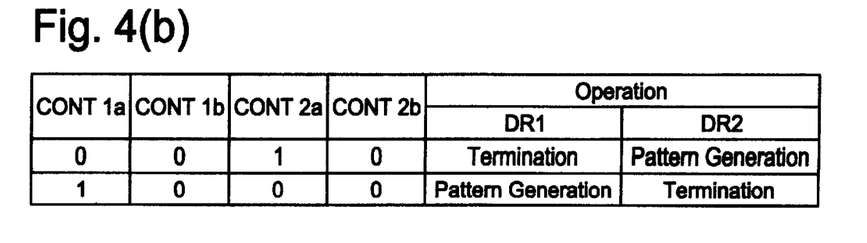

FIG. 1 shows a simplified block diagram of an I/O pin electronics circuit of the present invention which has two divided drivers. The drivers DR1 and DR2 are selectively provided with voltages from the voltage generation circuit 10 through a control circuit 9. The operation of the control circuit 9 is controlled by PAT and DRE signals from the wave formatter 11. FIG. 4 shows a detailed circuit diagram of the I/O pin electronics circuit of FIG. 1. In FIG. 4, the control circuit 9 in FIG. 1 is divided into a driver control 15, a switch 19, and a switch control 20. A wave formatter circuit and a supply/termination voltage generation circuit for one channel are respectively allocated to the two drivers DR1 and DR2. One of the drivers is connected to the input of a comparator CP which includes a comparison circuit and a comparison voltage generation circuit. The function of the CP is the same as that of the conventional example.

The wave formatter circuit generates a driver pattern (PAT) which changes high/low levels of the DR, and a DRE (Driver Enable) pattern which changes ON/OFF states of the DR. When the DR is on, the PAT signal is generated. When the DR is off, a terminal voltage VTT is produced at the driver output to function as the terminal impedance.

As shown in FIG. 4, the two separate drivers share the PAT signal, the DRE signal, the supply voltages VIH and VIL, and the terminal voltage VTT. The driver control circuit is provided so that the driver control operation for the DR1 and DR2 can be independently carried out.

Figure 2:
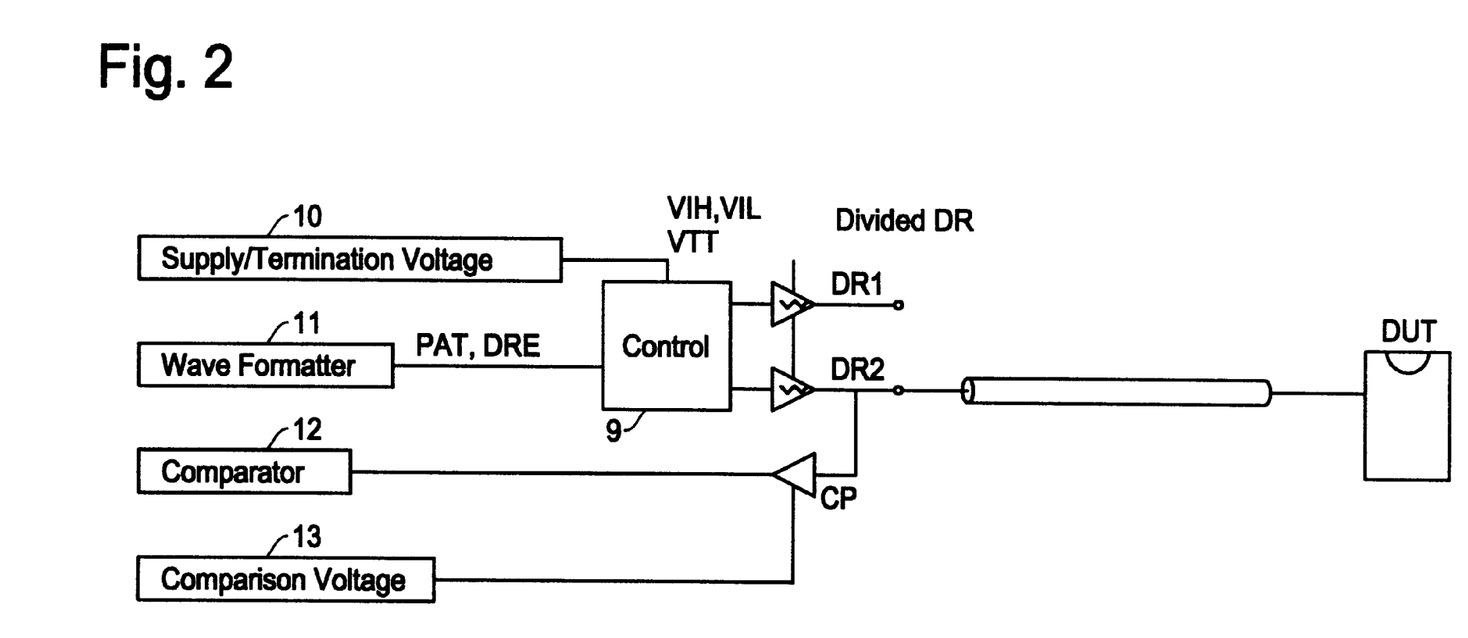
FIG. 2 is a circuit block diagram showing the configuration for performing the I/O common test using the I/O pin electronics circuit of the present invention.

In the I/O common test shown in FIG. 2, the DR2 is assigned to the DRE control mode by setting the CONT1a, CONT1b and CONT2b of FIG. 4 to logic "0" and the CONT2a of FIG. 4 to logic "1" so that the DR generates the outputs in response to the PAT signal. On the other hand, the DR1 is assigned to the termination condition to avoid interferences. By this arrangement, the I/O pin electronics circuit of the present invention functions the same way as in the conventional I/O common pin.

Figure 3:
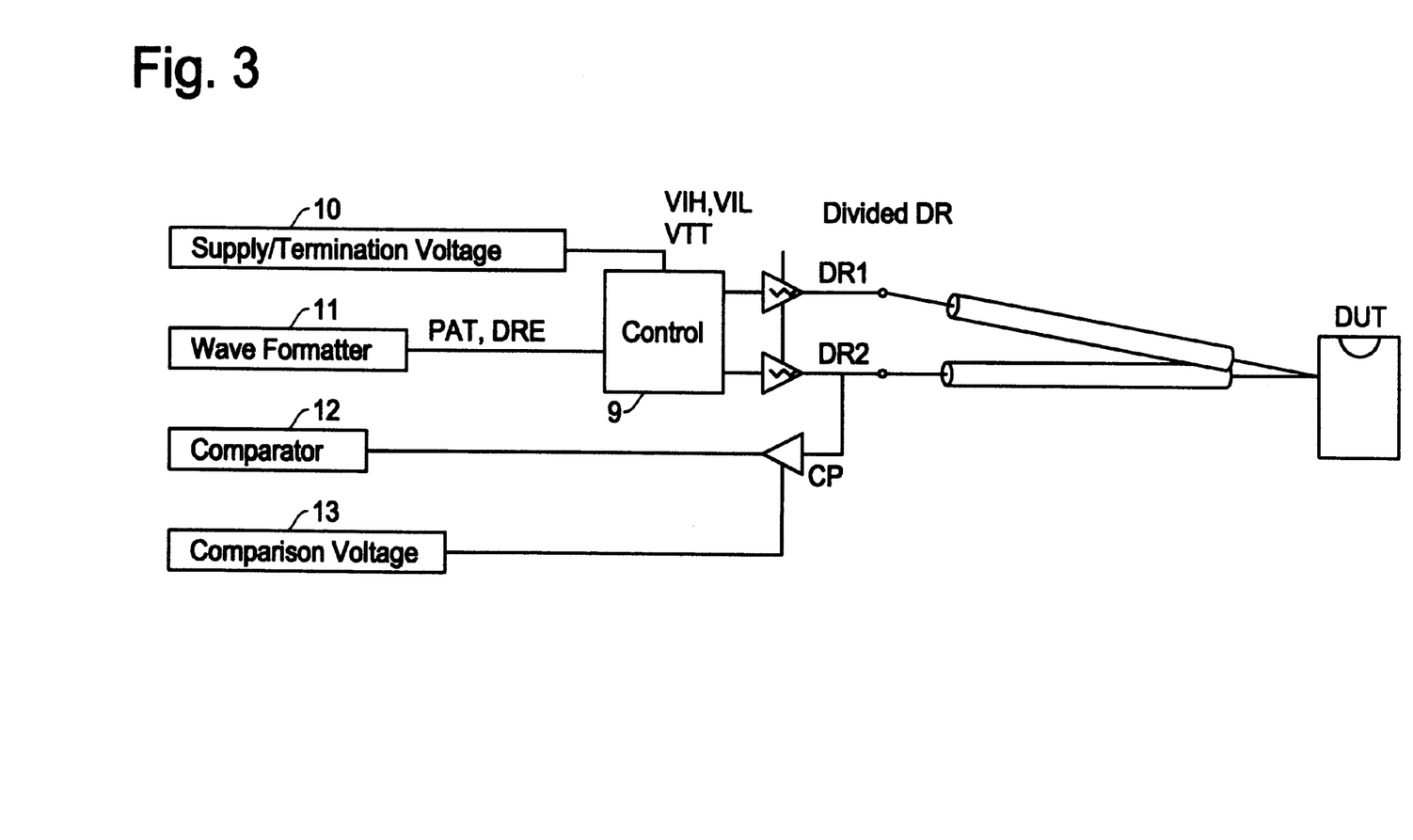
FIG. 3 is a circuit block diagram showing the configuration for performing the I/O separate test using the I/O pin electronics circuit of the present invention.

In the I/O separate test shown in FIG. 3, the DR1 is used under the DRE control mode so that the output according to the PAT signal is generated by setting the CONT1b, CONT2a and CONT2b of FIG. 4 to logic "0" and the CONT1a of FIG. 4 to logic "1". On the other hand, the DR2 is used as the terminal impedance for the CP.

In either case, no unused circuits exist in the comparison circuit, the comparison voltage generation circuit, the wave formatter circuit and the supply voltage generation circuit, and the number of devices (DUT) for the simultaneous test will not decrease.

Since it is configured as described in the foregoing, the present invention has the following effects.

(1) The conventional I/O common test can be performed using the DR2 and the CP.

(2) The I/O separate test can be performed by using the DR1 and the CP.

(3) There are no unused circuits either in the I/O common test or in the I/O separate test.

(4) The number of devices for the simultaneous test will not be reduced since one I/O pin electronic circuit can perform the I/O separate test.

(5) The number of wiring increases only between the DR, CP and the DUT in the I/O separate test compared to the I/O common test. Thus the number of wiring between the DR, CP and the semiconductor test system remains the same. When many DUTs are under test, the number of wiring for the I/O separate test is almost the same as that of the I/O common test, which can avoid the complexity of the wiring.

What is claimed is:

1. An I/O pin electronics circuit to be used in a semiconductor test system for testing semiconductor devices, comprising:

a voltage generation circuit for generating first and second drive voltages and a termination voltage to be used for testing a semiconductor device under test (DUT):

a wave formatter for generating a test pattern signal and a driver enable signal;

a first driver for directly supplying a first drive signal to a first pin of the DUT through a first signal path, the first drive signal being produced by a first combination of the drive voltages and the test pattern signal;

a second driver for directly supplying a second drive signal to a second pin of the DUT through a second signal path, the second drive signal being produced by a second combination of the drive voltages and the test pattern signal;

a control circuit connected between the first and second drivers and the wave formatter for controlling the operation of the first and second drivers based on the driver enable signal from the wave formatter; and a comparator, a first input of which is connected to both an output of the second driver and the second signal path, and a second input of which is provided with a reference voltage, for comparing an output signal of the DUT from the second signal path with the reference voltage;

wherein the first driver is disabled and the second driver is enabled by the driver enable signal in a first test mode while the second driver is disabled and the first driver is enabled by the driver enable signal in a second test mode.

2. An I/O pin electronics circuit as defined in claim 1, wherein the first test mode is an I/O common test mode in which the second driver directly provides the second drive signal to the DUT through the second signal path and the comparator receives the output signal of the DUT through the second signal path.

3. An I/O pin electronics circuit as defined in claim 1, wherein the second test mode is an I/O separate test mode in which the first driver directly provides the first drive signal to the DUT through the first signal path and the comparator receives the output signal of the DUT through the second signal path.

4. An I/O pin electronics circuit as defined in claim 1, wherein an output of the first driver is connected to a termination impedance and set to the termination voltage generated by the voltage generation circuit in the first test mode.

5. An I/O pin electronics circuit as defined in claim 1, wherein an output of the second driver is connected to a termination impedance and set to the termination voltage generated by the voltage generation circuit in the second test mode.

6. An I/O pin electronics circuit as defined in claim 1, wherein the predetermined reference voltage for the comparator is provided by a comparison voltage generator.

7. An I/O pin electronics circuit to be used in a semiconductor test system for testing semiconductor devices, comprising:

a voltage generation circuit for generating predetermined first and second drive voltages and a termination voltage to be used for testing a semiconductor device under test (DUT):

a wave formatter for generating a test pattern signal and a driver enable signal;

a first driver for directly supplying a first drive signal formed by the drive voltages and the test pattern signal to a first pin of the DUT through a first signal path;

a second driver for directly supplying a second drive signal formed by the drive voltages and the test pattern signal to a second pin of the DUT through a second signal path;

a control circuit connected between the first and second drivers and the wave formatter for controlling the operation of the first and second drivers based on the driver enable signal from the wave formatter; and a comparator, a first input of which is connected to both an output of the second driver and the second signal path, and a second input of which is provided with a reference voltage, for comparing an output signal of the DUT from the second signal path with the reference voltage;

wherein the control circuit disables the first driver so that the output of the first driver is set to the termination voltage from the voltage generation circuit in an I/O common test mode while the control circuit disables the second driver so that the output of the second driver is set to the termination voltage from the voltage generation circuit in an I/O separate test mode.

8. An I/O pin electronics circuit as defined in claim 7, wherein the second driver directly provides the second drive signal to the DUT through the second signal path and the comparator receives the output signal of the DUT through the second signal path in the I/O common test mode.

9. An I/O pin electronics circuit as defined in claim 7, wherein the first driver directly provides the first drive signal to the DUT through the first signal path and the comparator receives the output signal of the DUT through the second signal path in the I/O separate test mode.

* * * * *